United States Patent [19]

Chauvin et al.

[11] Patent Number: 4,540,956

[45] Date of Patent: Sep. 10, 1985

[54] HIGH FREQUENCY BAND-PASS AMPLIFIER WITH ADJUSTABLE IMPEDANCE AND OSCILLATOR INCLUDING IT

[75] Inventors: Jacques Chauvin, Sartrouville; Roger Molle, Le Kremlin-Bicetre, both of France

[73] Assignee: Compagnie d'electronique et de Piezo-Electricite C.E.P.E., Argenteuil, France

[21] Appl. No.: 590,643

[22] Filed: Mar. 19, 1984

[30] Foreign Application Priority Data

Mar. 18, 1983 [FR] France ............................. 83 04485

[51] Int. Cl.³ .......................................... H03B 5/36
[52] U.S. Cl. ................................ 331/116 R; 331/158; 330/306
[58] Field of Search .................. 330/154, 174, 306; 331/117 D, 117 R, 116 FE, 116 M, 116 R, 154, 158

[56] References Cited

U.S. PATENT DOCUMENTS 2,825,813  3/1958  Sperling .
3,354,325  11/1967  Isborn ........................... 331/117
3,375,466  3/1968  Pratt .
4,096,451  6/1978  Pradal .......................... 331/158 X
4,224,580  9/1980  Yoshisato et al. ............. 331/158 X

FOREIGN PATENT DOCUMENTS 1469614  1/1966  France .
2145990  7/1972  France .

OTHER PUBLICATIONS

"Aerial Booster", Elektor, vol. 2, No. 7-8, p. 723, Jul.–Aug. 1976.

Primary Examiner—James B. Mullins
Assistant Examiner—Steven J. Mottola
Attorney, Agent, or Firm—Oblon, Fisher, Spivak, McClelland & Maier

[57] ABSTRACT

The subject of the invention is a high frequency band-pass amplifier with adjustable impedance, in particular for a high frequency quartz resonator. It includes a transistor T connected in common base the emitter of which is connected to ground by a resistive divider bridge ($R_2$, $R_1$) the mid-point of which forms the input of the amplifier. The collector of the transistor (T) is connected to ground by a parallel circuit (LC) having one inductive side (L) and one capacitive side (C), a mid-point of the inductive side (L) or of the capacitive side (C) forming an output ($s_1$ or $s_2$) of the amplifier (A). The base of the transistor is biased and connected to ground via a capacitor ($C_3$) ensuring common base operation in the pass-band of the amplifier. The invention also relates to an oscillator of transmission type including such an amplifier and a resonator (1) connected between the input (e) and one output ($s_1$ or $s_2$) of the amplifier (A). The frequency of resonance of the parallel circuit (LC) is equal to a chosen frequency of the resonator (1).

12 Claims, 7 Drawing Figures

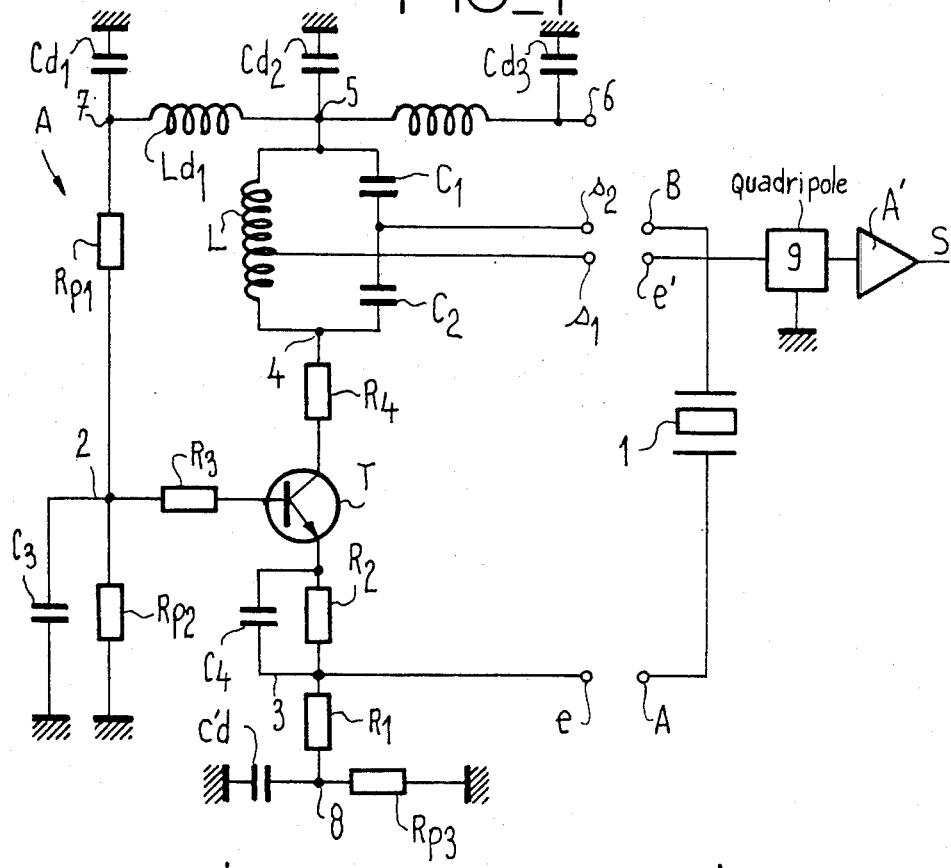
FIG_1
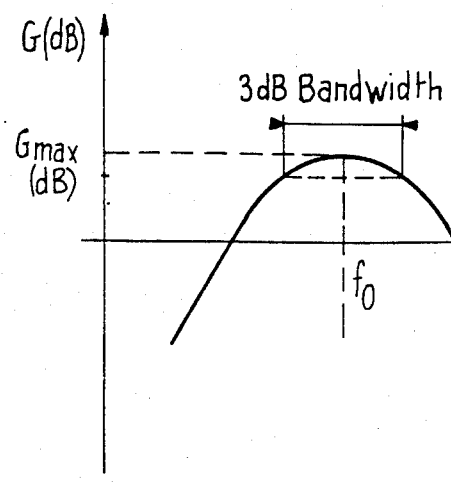
FIG_3
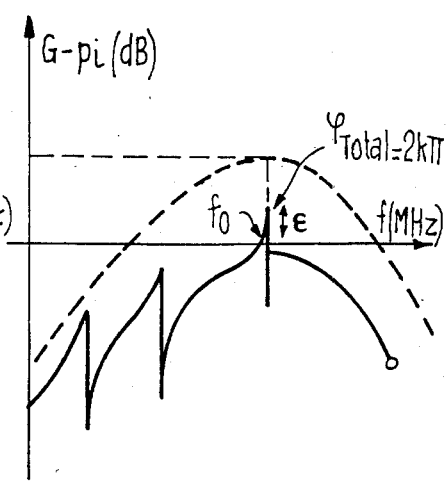
FIG_4

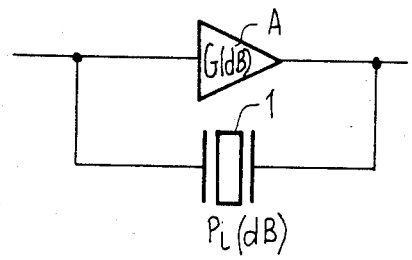
FIG_5
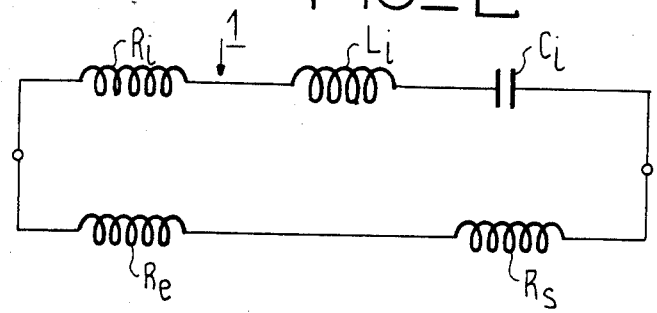
FIG_2
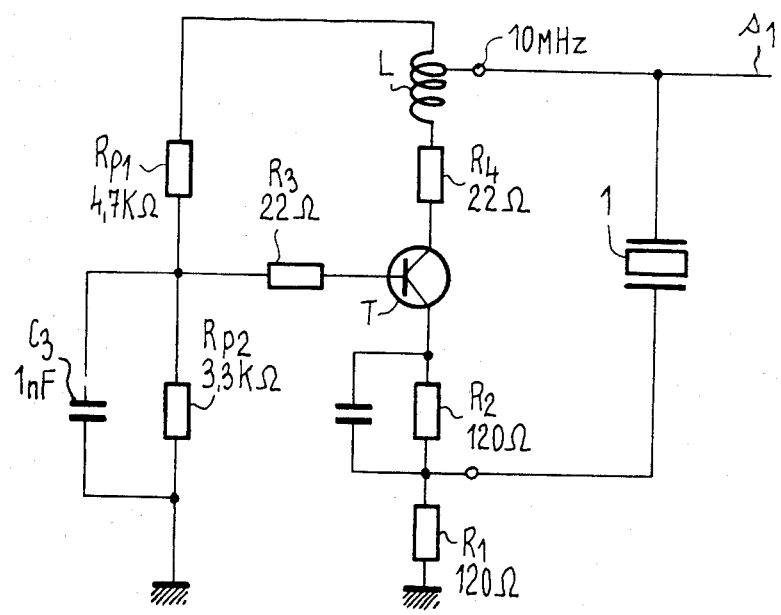
FIG_7

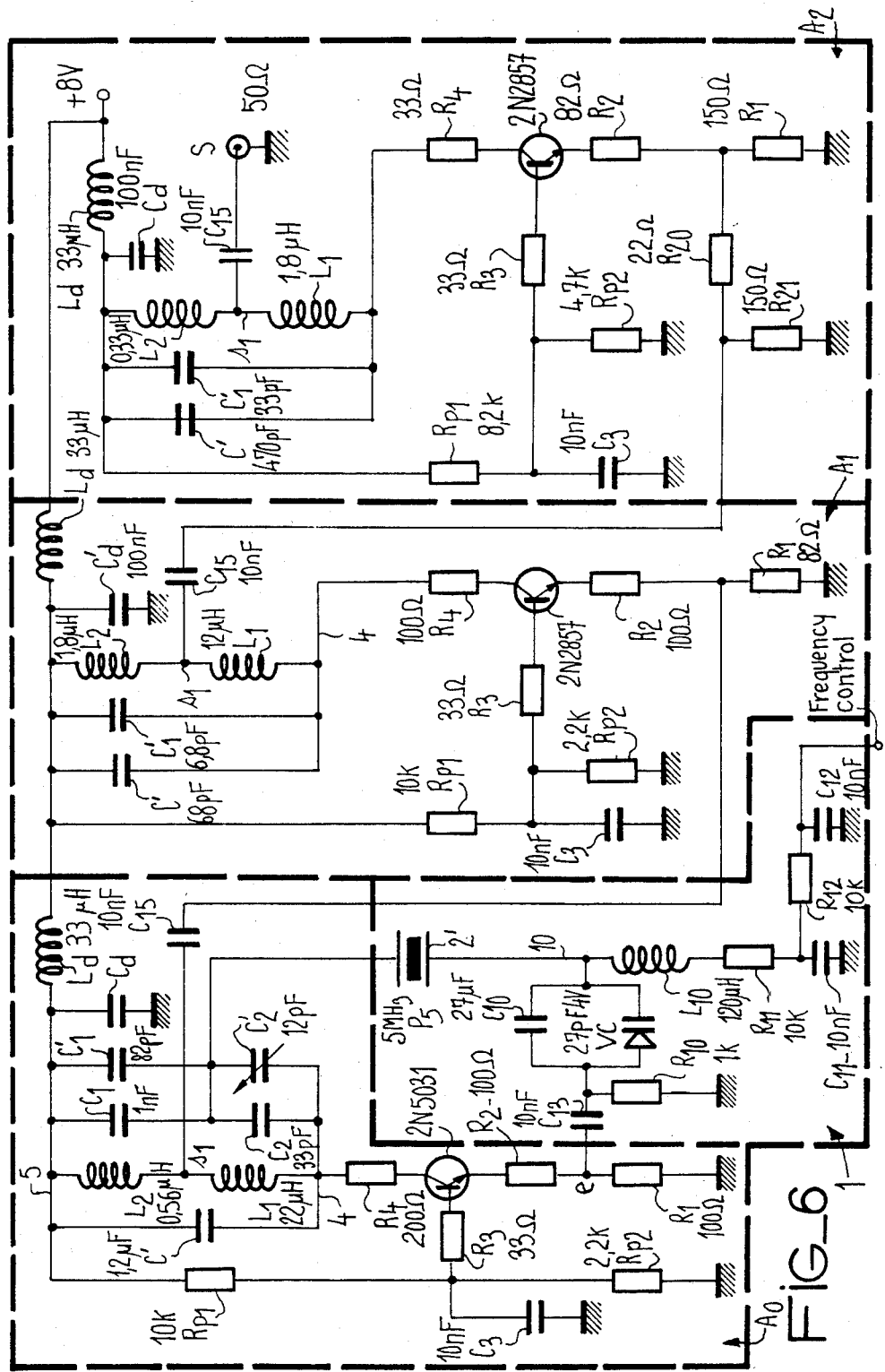
FIG_6

HIGH FREQUENCY BAND-PASS AMPLIFIER WITH ADJUSTABLE IMPEDANCE AND OSCILLATOR INCLUDING IT

BACKGROUND OF THE INVENTION (i) Field of the Invention

The subject of this invention is a high frequency band-pass amplifier with adjustable impedance and also an oscillator including it.

(ii) Description of the Prior Art

Known high frequency band-pass amplifiers usually have high input and output impedances (of the order of several thousand ohms) which makes them sensitive to the thermal drift of the semiconductors they contain.

In addition, amplifiers used to produce high frequency oscillators (particularly in Hartley type configurations) also have input and output impedances of the same order of magnitude. A disadvantage of these high impedances is the degradation of the quality factor Q of the resonator included in the oscillator. Such an oscillator therefore has a characteristic frequency that is less stable than it could be.

The subject of this invention is a high frequency band-pass amplifier the impedance of which is adjustable and which, in particular, can have low value input and output impedances.

Such an amplifier is suitable for producing oscillators given that the input and output impedances can be low which prevents degradation of the quality factor Q of the resonator. In another connection, such an amplifier is also appropriate for the amplification of the signals output by an oscillator, in particular an oscillator according to the invention with low output impedance.

SUMMARY OF THE INVENTION

The invention thus relates to a high frequency band-pass amplifier with adjustable impedance which includes a transistor connected in common base the emitter of which is loaded by a resistive divider bridge including a first resistor connected to ground and to a point called the mid-point of the resistive divider bridge, connected in series with a second resistor connected to the said mid-point and to the emitter of the transistor, the said mid-point of the resistive divider bridge forming the input of the amplifier, the collector of which is loaded by a parallel LC circuit one end of which is at the power supply voltage and having one inductive side and one capacitive side, a point, called the mid-point, of the inductive side or of the capacitive side forming an output of the amplifier, and the base of which is biased by a DC supply voltage and connected to ground via a capacitor ensuring common base operation in the pass-band of the amplifier.

According to a preferred embodiment, the parallel circuit is associated with a damping resistor, preferably connected between the collector of the transistor and the actual parallel circuit. This resistor lowers the quality factor of the parallel circuit and widens the pass band of the amplifier.

According to a variant, the transistor is of a type having a negative resistance characteristic when operating in common base and having a base resistor of sufficient value to compensate for it, in such a way that the self oscillation of the amplifier is thereby prevented.

According to a variant, the first resistor of the resistive divider bridge is chosen such that the amplifier has a low input impedance.

The capacitive or inductive impedance between at least one output of the amplifier and ground can be chosen such that the amplifier has a low output impedance.

The oscillator according to the invention is of transmission type and it includes an amplifier such as defined above and a resonator connected between its input and one of its outputs. The frequency of resonance of the parallel circuit is equal to a chosen frequency of the resonator and the amplifier is adjusted such that the open loop transfer function fulfills the Berkhausen conditions only for the resonance peak of the resonator corresponding to the chosen frequency. The input and output impedances of the amplifier are preferably at most equal to the intrinsic series resistance of the resonator, in order to avoid degrading the intrinsic quality factor of the resonator. In practice, we will try to obtain the lowest input and output impedances compatible with the gain condition defined above.

According to a variant, a capacitor is connected across the second resistor of the divider bridge. This capacitor can be used when the amplifier gain is insufficient.

It can be advantageous to connect the first resistor of the divider bridge to ground via a decoupling capacitor across which a third resistor is connected to reduce the power consumed.

One of the outputs of the amplifier can be connected to an amolifier circuit having a matched impedance, for example an output amplifier associated with a quadripole the input of which is connected to the said output of the amplifier and the output to the input of the output amplifier having an input impedance matched to the impedance of the said output of the amplifier and an output impedance matched to the input impedance of the output amplifier. In particular, the amplifying circuit can be formed by at least one amplifier according to the invention.

BRIEF DESCRIPTION OF THE DRAWINGS

The invention will be better understood on reading the following description given as a non-limiting example, in connection with the figures which represent:

in FIG. 1, a circuit diagram of an amplifier according to the invention, and its coupling to a resonator to form an oscillator;

in FIG. 2, an equivalent electric circuit diagram of a resonator connected in an oscillator;

in FIG. 3, the transfer function of a bandpass amplifier according to the invention;

in FIG. 4, the open loop transfer function of an oscillator according to the invention;

in FIG. 5, a diagram illustrating the Berkhausen condition;

in FIG. 6, a 5 megahertz oscillator according to the invention associated with two amplifier stages each using an amplifier according to the invention;

in FIG. 7, a 500 megahertz oscillator according to the invention.

DESCRIPTION OF PREFERRED EMBODIMENTS

According to FIG. 1, an amplifier A according to the invention includes a transistor T operating in common base. Its base is biased by a bridge of resistors $R_{P1}$ and $R_{P2}$ by a DC supply voltage V taken to one end of resistor $R_{P1}$ (point 7). Common base operation of the amplifier in the pass-band is obtained due to a capacitor $C_3$ connected in parallel to resistor $R_{P2}$ between the base and ground. In the case in which the transistor T is likely to have a negative resistance characteristic in common base, a base resistor $R_3$ is connected at the input of the base of transistor T. This is particularly the case of high frequency FE transistors, i.e. designed to operate in common emitter, and which have this property when they are used in a common base configuration.

Resistor $R_3$ is connected between the base of transistor T and the mid-point 2 of the resistor bridge ($R_{P1}$, $R_{P2}$).

The emitter of the transistor is connected to ground by a resistive bridge formed from two resistors $R_2$ and $R_1$, resistor $R_2$ being connected to the emitter, the common point 3 to the resisters $R_1$ and $R_2$ forming the input e of the amplifier, and the other end of resistor $R_1$ (point 8) being connected to ground, possibly via a decoupling capacitor $C_d'$.

The collector circuit successively includes a damping resistor $R_4$ and a parallel LC circuit including a first inductive side L and in parallel with it a second capacitive side including two capacitors $C_2$ and $C_1$ in series. One end of capacitor $C_1$ (point 5) is connected at the end to the coil L which is at the supply voltage V and its other end to the common point of capacitors $C_1$ and $C_2$ which forms one of the outputs of the amplifier labeled $s_2$. Capacitor $C_2$ is also connected to the other end of the coil L (point 4) and to the damping resistor $R_4$. Another output of the amplifier $s_1$ is taken from one of the turns of the coil L. A coil of value $L_1$ is then present between point 5 and the output $s_1$ and a coil of value $L_2$ between output $s_1$ and point 4, where $L = L_1 + L_2$. It stands to reason that the inductive side L can include, by analogy with the capacitive side, two coils connected in series and the common point of which then forms the output $s_1$ of the amplifier. These coils will, by analogy, be called $L_1$ and $L_2$.

The amplifier is supplied at point 6 with a DC voltage V. A decoupling capacitor $C_{d3}$ is connected between point 6 and ground and a decoupling coil $L_{d2}$ is connected in series between points 6 and point 5, in order to form a traditional LC decoupling which isolates the amplifier from high frequency interference. In the same way, the supply of point 7 by the voltage V is achieved with the interposition of a decoupling coil $L_{d1}$ between points 5 and 7. A decoupling capacitor $C_{d2}$ is connected between point 5 and ground and a decoupling capacitor $C_{d1}$ between point 7 and ground. Decoupling is also carried out at the emitter level where a decoupling capacitor $C_d'$ is connected between point 8 and ground. It stands to reason that these decouplings are only made if the amplifier is likely to be subject to high frequency interference. If this is not so, points 6, 7 and 8 can be connected directly to ground.

We will now show how the values of the components appearing in the circuit diagram of the amplifier A are determined. The resistors $R_{p1}$ and $R_{p2}$ which define the bias are determined in the traditional way. Their value is usually equal to a few thousand ohms. Capacitor $C_3$ ensures that the amplifier operates in common base in the pass-band, i.e. that in the pass-band of the amplifier, the impedance of capacitor $C_3$ must oe sufficiently low for point 2 to be practically at ground, the resistor bridge ($R_{p1}$, $R_{p2}$) continuing meanwhile to provide the DC bias to the base of the transistor. The value of the capacitor $C_3$ is consequently lower as the operating frequency increases. As an example, values of the order of 10 nF are appropriate to 5 megahertz and of the order of 1 nF in the region of 300 to 500 megahertz. This value can fall to 50 pF for frequencies greater than or equal to 500 megahertz.

The purpose of resistor $R_3$ is to prevent the input impedance of the transistor T from becoming negative. This can occur as explained above with transistors that have this property when they are connected in common base. Resistor $R_3$ usually has a low value, for example lower than 50 ohms.

$R_2$ is important in determining the gain of the amplifier. As the value of $R_2$ increases, the gain of the amplifier decreases. Resistor $R_2$ also helps, but in an auxiliary way, to prevent the input resistance of the amplifier from becoming negative.

$R_1$ determines the input impedance of the amplifier and acts as a stabilizer of this impedance in the presence of variations in external parameters (supply voltage, amplifier load, temperature). This stabilization becomes better as the value of resistor $R_1$ decreases.

Capacitor $C_4$, connected in parallel with resistor $R_2$, is only used when the gain of the amplifier is insufficient. Its value is very low. Capacitor $C_4$ dynamically lowers the value of the impedance between the emitter and point 3 and consequently increases the gain of the amplifier, without however the emitter of transistor T being loaded with too low a DC impedance. The value of $C_4$ is determined by displaying the curve of FIG. 4 on the network analyzer. The introduction of a capacitor $C_4$ of low value slightly raises the open loop transfer function in the region of $f_O$ and therefore adjusts the value of $\epsilon$ (dB) which enables the oscillator to start. In practice a value of $\epsilon = 2$ to 3 dB is chosen.

Resistor $R_{p3}$ connected in parallel with the decoupling capacitor $C_d'$ adjusts the consumption of the amplifier. It can therefore be omitted if the consumption is not an important factor. Resistor $R_{p3}$ will be chosen to obtain a minimum consumption. It stands to reason that resistor $R_{p3}$ works in conjunction with decoupling capacitor $C_D'$ which because of this must be present even if from other considerations it is not considered useful to protect amplifier A from high frequency interference.

If we let $V_B$ be the base voltage of the transistor and v the voltage drop in the junction, we have $$I = \frac{V_2 - v}{R_1 + R_2 + R_{p3}}$$

If we impose the base current I, we have:

$$R_{p3} = \frac{V_2 - v}{I} - (R_1 + R_2)$$

Example:
V = 8v, $R_{P1} = 10$ kΩ, $R_{P2} = 2.2$ kΩ, $R_1 = R_2 = 100$Ω, v = 0.6 V
in the absence of $R_{P3}$ we will have I = 4.2 mA, but for $R_{P3} = 100/L$, I = 2.8 mA.

The value of components L, $C_1$ and $C_2$ determines the resonant frequency of the parallel LC circuit connected to the collect9r of transistor T. This LC circuit has an intrinsic quality factor which can be lowered by the presence of resistor $R_4$. $R_4$ is therefore essentially used to damp the tuned LC circuit and by this to determine the width of the pass-band of the amplifier. As the resistor $R_4$ damps the tuned LC circuit, it also has the effect of reducing the gain of the amplifier A, this effect increasing as its value increases. In practice the value of the resistor $R_2$ determines the gain of the amplifier A. In fact the quality factor of the tuned LC circuit, and therefore the value of resistor $R_4$, is determined by the pass-band that we wish to obtain around the frequency $f_O$ of the tuned LC circuit.

Outputs $s_1$ and $s_2$ being connected by an inductive divider bridge and capacitive divider bridge respectively, the gain of the amplifier is also dependent on the impedance division ratio thus produced. However, the division ratio chosen also affects the output impedance of the amplifier A. Thus, with regard to output $s_1$, the output impedance will be lower and the gain higher as the value of the resultant inductance between the output $s_1$ and point 5 decreases. As regards output $s_2$, the output impedance will be lower and the gain of the amplifier higher as the capacity of capacitor $C_1$ increases. As the output impedance of amplifier A is also a value fixed in advance, the gain of amplifier A is, for this reason also, determined in practice by changing the value of resistor $R_2$.

A resonator 1 can be connected as a feedback to the amplifier A to form an oscillator. This feedback can be made between input e and either one of the outputs $s_1$ and $s_2$. The output of the useful signal of the oscillator will then preferably be made by the output of amplifier A that is not used for the feedback loop of the oscillator.

Resistor $R_1$ will be chosen at a value lower than or equal to the internal resistor $R_i$ of the resonator 1 such that on the one hand the resonator is loaded by an impedance as low as possible to prevent degradation of its quality factor Q and on the other hand that the load impedance is matched as far as possible in order to prevent reflection of the energy transmitted by the resonator 1. The same applies concerning the determination of the value of the output impedance used for the feedback of the resonator 1.

As shown in FIG. 1, one of the outputs ($s_1$, $s_2$) of the amplifier (A) is connected to an amplification circuit having a matched impedance. The amplification circuit incldues at least one output amplifier (A') and a quadripole (9). The input of quadripole 9 is connected to the output of the amplifier (A) and the output thereof is connected to the input of the output amplifier (A') and has an input impedance matched to the impedance of the output of the amplifier (A) and an output impedance matched to the input impedance of the output amplifier (A'). The amplifier (A') can have the same structure as the amplifier (A).

According to FIG. 2, the equivalent electric circuit diagram of the resonator 1 is a resistor $R_i$ in series with a capacitor $C_i$ and a coil $L_i$. The resonator 1 is loaded by two resistors in series $R_e$, the resistive component of the input impedance of amplifier A, and $R_s$, the resistive component of the output impedance of amplifier A. This resistive load results in the on-load quality factor $Q_c$ of the resonator being lower than the intrinsic quality factor $Q_i$ determined by the value of $R_i$. The performance of the oscillator will be proportionally better as the onload quality factor of the resonator $Q_c$ becomes higher and closer to the intrinsic value $Q_i$.

FIG. 3 shows the response curve of amplifier A without feedback. This response curve has a maximum gain $G_{max}$ at frequency $f_O$ corresponding to the resonance of the LC circuit, this curve falling off towards frequencies lower and external to frequency $f_O$ towards asymptotes of 12 decibels per octave slope.

FIG. 4 shows the difference between the gain and the insertion loss of the oscillator as a function of frequency. This is the open loop gain of the system.

FIG. 5 illustrates the operating condition of an oscillator called the Berkhausen condition. The oscillator is formed from an amplifier A having a gain G; a resonator 1 with an insertion loss $P_i$ is connected in feedback between the output and input of this amplifier. The Berkhausen condition is written:

$$G = P_i + \epsilon (dB)$$

where $\epsilon$ is the excess of gain necessary to start the oscillator. An oscillator can therefore only start up for frequencies at which the difference $G - P_i$ is equal to $\epsilon$. The LC network being tuned to the frequency $f_O$ of the resonator, the gain of the amplifier A is adjusted such that the resonance peak of the resonator 1 at frequency $f_O$ is alone able to fulfill the Berkhausen condition. As a result of this the tuned LC circuit does not need to have a high quality factor Q. On the contrary, a high quality factor of the tuned LC circuit would make adjustment of the gain rather difficult, resulting in a risk of starting up the oscillator at the frequency of the tuned LC circuit and not at the precise and stable frequency of the resonator 1. In fact the resonators have dynamic resonance peaks that are weaker and weaker as the frequency increases. In order to facilitate adjustments, we will therefore in practice try to dampen the tuned LC circuit as much as possible while allowing the amplifier A to have a sufficient gain to fulfill the Berkhausen condition.

According to FIG. 6, an oscillator and its two associated amplifier stages are each formed from an amplifier according to the invention. The same notations have been retained to indicate components corresponding to the basic diagram of FIG. 1. Close notations have been used for components connected according to variants, particularly with regard to the tuned LC circuits for which networks of different configuration can be brought into use in particular cases.

The oscillator stage is composed of an amplifier $A_O$ for which we have:

$R_{P1} = 10$ k$\Omega$, $R_{P2} = 2.2$ k$\Omega$, $R_1 = 100\Omega$,
$R_2 = 100\Omega$, $R_3 = 33\Omega$, $R_4 = 200\Omega$; $C_1 = 1$ nF,
$C_2 = 33$ pF and $C_3 = 10$ nF.

A capacitor $C_1'$ of 82 pF is connected across capacitor $C_1$ and a variable capacitor $C_2'$ of nominal value 12 pF is connected across capacitor $C_2$. In addition at points 4 and 5 a capacitor $C'$ of 1.2 pF is connected in parallel to the above capacitors. This capacitive network permits accurate adjustment of the frequency of the LC circuit to the frequency $f_O$ of the resonator 1, in spite of the sometimes large tolerances on the actual values of the capacities. The values given above are therefore given as an indication and the nominal values to be chosen depend in fact on the real value of the capacities of the capacitors in the manufacturing tolerance limits.

The resonator 1 includes a quartz crystal 2' and a Varicap diode VC frequency control circuit. This has a nominal value of 27 pF and a nominal voltage of 4 volts. This is shunted by a capacitor $C_{10}$ of value 27 pF. The Varicap diode VC is connected in series with the quartz crystal 2' between one electrode 10 of the quartz crystal and the input e of the amplifier $A_O$. The frequency control circuit is fed with a variable DC voltage appearing across a capacitor $C_{12}$. A coil $L_{10}$ of 120 $\mu$H, L a resistor $R_{11}$ of 10 k$\Omega$ and a capacitor $C_{11}$ of 10 nF are successively connected in series between point 10 and ground. The non-grounded electrode of capacitor $C_{12}$ is connected to the non-grounded electrode of capacitor $C_{11}$ through a resistor $R_{12}$ of 10 k$\Omega$.

Also, the positive electrode of the Varicap diode VC is connected to ground through a resistor $R_{10}$ of 1 k$\Omega$ and to the input e of the amplifier $A_O$ through a capacitor $C_{13}$ of 10 nF. The active output $s_1$ of amplifier $A_O$ of the oscillator is connected to the input of the following amplifier $A_1$ by a series capacitor $C_{15}$ of value 10 nF.

For amplifier $A_1$, we will have $R_1=82$, $R_2=100\Omega$, $R_3=33\Omega$, $R_4=100\Omega$, $R_{P1}=10$ k , $R_{P2}=2.2$ k$\Omega$ $L_1=12$ $\mu$H, $L_2=1.8\mu$H. As output $s_2$ is not used in this circuit, only two capacitors in parallel $C'$ of value 68 pF and $C_1'$ of value 6.8 pF are connected between points 4 and 5. Output $s_1$ is connected to the input of the next stage $A_2$ through a decoupling capacitor $C_{15}$ of value 10 nF. The input to amplifier $A_2$ is not made directly across the resistor $R_1$ but via a divider bridge comprising a resistor $R_{20}$ of 22$\Omega$ and a resistor $R_{21}$ of 150$\Omega$ of which one end is connected to ground. For amplifier stage $A_2$, we have:

$R_1=150\Omega$, $R_2=82\Omega$, $R_3=33\Omega$, $R_4=33\Omega$,
$R_{p1}=8.2$ k$\Omega$, $R_{P2}=4.7$ k$\Omega$, $L_1=1.8$ $\mu$H,
$L_2=0.33$ $\mu$H, $C'=470$ pF, $C_1'=33$ pF, $C_3=$nF. Output S of amplifier $A_2$ is the output $s_1$. The value of the decoupling coils $L_D$ of the various stages is 33 $\mu$H, the decoupling capacitors $C_D$ having a value of 10 nF.

According to FIG. 7, the resonator 1 has a natural frequency of 500 megahertz. The values of the components are then:

$R_1=R_2=120\Omega$, $R_3=R_4=22\Omega$, $R_{P1}=4.7$ k$\Omega$,
$R_{P2}=3.3$ k$\Omega$; L=10 nH and $C_3=1$ nF. It will be noted that the LC network is made without the addition of capacitive components given that, at these high frequencies, the parasitic capacity of the transistor T is sufficient (it is of the order of 1 pF).

We claim:

1. An oscillator comprising:
  a high frequency band-pass amplifier with adjustable impedance, said amplifier comprising a transistor connected in common base and having an emitter loaded by a resistive divider bridge including a first resistor connected to ground and to a point called the mid-point of the resistive divider bridge, connected in series with a second resistor connected to said mid-point and to the emitter of the transistor, said mid-point of the resistive divider bridge forming the input of the amplifier, said transister having a collector loaded by a parallel LC circuit one end of which is connected to a power supply voltage and having one inductive side and one capacitive side (c), two points, called the midpoints, of the inductive side (L) and or the capacitive side, respectively, (C) forming the outputs of the amplifier said transistor having a base biased by a DC supply voltage and connected to ground via a capacitor ensuring common base operation in the pass-band of the amplifier; and,
  a resonator connected between the input and one output of the amplifier, wherein the frequency of resonance ($f_O$) of the parallel circuit (LC) is equal to a chosen frequency ($f_O$) of the resonator, and the amplifier is adjusted such that the open loop transfer function fulfills the Berkhausen conditions only for the resonance peak of the resonator corresponding to the chosen frequency ($f_O$).

2. An oscillator as claimed in claim 1, wherein the parallel circuit (LC) is associated with a damping resistor.

3. An oscillator as claimed in claim 2, wherein the damping resistor is connected between the collector of the transistor and the parallel circuit (LC).

4. An oscillator as claimed in claim 1, wherein the transistor is of a type having a negative resistance characteristic when operating in common base and having a base resistor of sufficient value to compensate for it.

5. An oscillator as claimed in claim 1, wherein the first resistor of the resistive divider bridge is chosen such that the amplifier has a low impedance.

6. An oscillator as claimed in claim 1, wherein the impedance situated between at least one output of the amplifier and ground is chosen such that the amplifier has a low output impedance.

7. An oscillator as claimed in claim 1, wherein the input and output impedances of the amplifier are at most equal to an intrinsic series resistance of the resonator.

8. An oscillator as claimed in claim 1, wherein a capacitor ($C'$) is connected across the second resistor of the divider bridge.

9. An oscillator as claimed in claim 1, wherein the first resistor of the divider bridge is connected to ground via a decoupling capacitor across which is connected a third resistor enabling optimization of the consumed power.

10. An oscillator as claimed in claim 1, wherein the other of the outputs of the amplifier is connected to an amplification circuit having a matched impedance.

11. An oscillator as claimed in claim 10, wherein said amplification circuit includes an output amplifier (A') and a quadripole of which the input is connected to said other output of the amplifier and the output to the input of the output amplifier and having an input impedance matched to the impedance of the said output of the amplifier and an output impedance matched to the input impedance of the output amplfier (A').

12. An oscillator as claimed in claim 10, wherein the amplification circuit comprises at least one amplifier having the same structure as said high frequency bandpass amplifier.

* * * * *